(12) United States Patent
Beffa

(10) Patent No.: US 7,502,659 B2
(45) Date of Patent: **\*Mar. 10, 2009**

(54) SORTING A GROUP OF INTEGRATED CIRCUIT DEVICES FOR THOSE DEVICES REQUIRING SPECIAL TESTING

(75) Inventor: Raymond J. Beffa, Boise, ID (US)

(73) Assignee: Micron Technology, Inc., Boise, ID (US)

( \* ) Notice: Subject to any disclaimer, the term of this patent is extended or adjusted under 35 U.S.C. 154(b) by 0 days.

This patent is subject to a terminal disclaimer.

(21) Appl. No.: 11/543,246

(22) Filed: Oct. 3, 2006

(65) Prior Publication Data

US 2007/0239308 A1 Oct. 11, 2007

Related U.S. Application Data

(63) Continuation of application No. 11/240,178, filed on Sep. 29, 2005, now Pat. No. 7,117,063, which is a continuation of application No. 10/791,193, filed on Mar. 2, 2004, now Pat. No. 7,107,117, which is a continuation of application No. 10/379,257, filed on Mar. 3, 2003, now Pat. No. 6,788,993, which is a continuation of application No. 09/607,201, filed on Jun. 28, 2000, now Pat. No. 6,529,793, which is a continuation of application No. 09/145,758, filed on Sep. 2, 1998, now Pat. No. 6,122,563, which is a continuation of application No. 08/801,565, filed on Feb. 17, 1997, now Pat. No. 5,844,803.

(51) Int. Cl.
*G06F 19/00* (2006.01)

(52) U.S. Cl. ............... 700/121; 700/95; 700/108; 700/109; 700/213; 250/306; 250/492.1; 250/234

(58) Field of Classification Search ............... 700/116, 700/121, 95, 108, 109, 213; 250/306, 492.1, 250/234

See application file for complete search history.

(56) References Cited

U.S. PATENT DOCUMENTS 4,027,246 A 5/1977 Caccoma et al.

(Continued)

FOREIGN PATENT DOCUMENTS

EP 0849675 A2 6/1998

(Continued)

OTHER PUBLICATIONS

Fresonke, Dean, *In-Fab Identification of Silicon Wafers with Clean, Laser Marked Barcodes*, Advanced Semiconductor Manufacturing Conference and Workshop, 1994, IEEE/SEMI, pp. 157-160.

*Primary Examiner*—Michael D. Masinick
(74) *Attorney, Agent, or Firm*—TraskBritt

(57) ABSTRACT

A method for sorting integrated circuit (IC) devices of the type having a fuse identification (ID) into those devices requiring enhanced reliability testing and those requiring standard testing includes storing fabrication deviation data, probe data, and test data in association with the fuse ID of each of the devices indicating each of the devices requires either enhanced reliability testing or standard testing. The fuse ID of each of the devices is then automatically read before, during, or after standard testing of the devices. The testing process requirement data stored in association with the fuse ID of each of the devices is then accessed, and the devices are sorted in accordance with the accessed data into those devices requiring enhanced reliability testing and those requiring standard testing.

34 Claims, 2 Drawing Sheets

U.S. PATENT DOCUMENTS

| | | | |
|---|---|---|---|
| 4,032,949 A | 6/1977 | Bierig |
| 4,150,331 A | 4/1979 | Lacher |
| 4,454,413 A | 6/1984 | Morton, Jr. |
| 4,455,495 A | 6/1984 | Masuhara et al. |
| 4,460,999 A | 7/1984 | Schmidt |
| 4,510,673 A | 4/1985 | Shils et al. |
| 4,534,014 A | 8/1985 | Ames |
| 4,667,403 A | 5/1987 | Edinger et al. |
| 4,736,373 A | 4/1988 | Schmidt |
| 4,796,194 A | 1/1989 | Atherton |
| 4,871,963 A | 10/1989 | Cozzi |
| 4,954,453 A | 9/1990 | Venutolo |
| 4,958,373 A | 9/1990 | Usami et al. |
| 4,967,381 A | 10/1990 | Lane et al. |
| 4,985,988 A | 1/1991 | Littlebury |
| 5,003,251 A | 3/1991 | Fuoco |
| 5,014,208 A | 5/1991 | Wolfson |
| 5,043,657 A | 8/1991 | Amazeen et al. |
| 5,103,166 A | 4/1992 | Jeon et al. |
| 5,105,362 A | 4/1992 | Kotani |
| 5,110,754 A | 5/1992 | Lowrey et al. |
| 5,118,369 A | 6/1992 | Shamir |
| 5,175,774 A | 12/1992 | Truax et al. |
| 5,197,650 A | 3/1993 | Monzen et al. |
| 5,217,834 A | 6/1993 | Higaki |
| 5,219,765 A | 6/1993 | Yoshida et al. |
| 5,226,118 A | 7/1993 | Baker et al. |
| 5,235,550 A | 8/1993 | Zagar |
| 5,253,208 A | 10/1993 | Kang |
| 5,256,562 A | 10/1993 | Vu et al. |
| 5,256,578 A | 10/1993 | Corley et al. |
| 5,271,796 A | 12/1993 | Miyashita et al. |
| 5,289,113 A | 2/1994 | Meaney et al. |
| 5,294,812 A | 3/1994 | Hashimoto et al. |
| 5,296,402 A | 3/1994 | Ryou |
| 5,301,143 A | 4/1994 | Ohri et al. |
| 5,326,709 A | 7/1994 | Moon et al. |
| 5,345,110 A | 9/1994 | Renfro et al. |
| 5,347,463 A | 9/1994 | Nakamura et al. |
| 5,350,715 A | 9/1994 | Lee |
| 5,352,945 A | 10/1994 | Casper et al. |
| 5,355,320 A | 10/1994 | Erjavic et al. |
| 5,360,747 A | 11/1994 | Larson et al. |
| 5,399,531 A | 3/1995 | Wu |
| 5,420,796 A | 5/1995 | Weling et al. |
| 5,424,652 A | 6/1995 | Hembree et al. |
| 5,428,311 A | 6/1995 | McClure |
| 5,440,240 A | 8/1995 | Wood et al. |
| 5,440,493 A | 8/1995 | Doida |
| 5,442,561 A | 8/1995 | Yoshizawa et al. |
| 5,448,488 A | 9/1995 | Oshima |
| 5,450,326 A | 9/1995 | Black |
| 5,467,304 A | 11/1995 | Uchida et al. |
| 5,477,493 A | 12/1995 | Danbayashi |
| 5,483,175 A | 1/1996 | Ahmad et al. |
| 5,495,417 A | 2/1996 | Fuduka et al. |
| 5,504,369 A | 4/1996 | Dasse et al. |
| 5,511,005 A | 4/1996 | Abbe et al. |
| 5,516,028 A | 5/1996 | Rasp et al. |
| 5,537,325 A | 7/1996 | Iwakiri et al. |
| 5,538,141 A | 7/1996 | Gross, Jr. et al. |
| 5,539,235 A | 7/1996 | Allee |
| 5,550,838 A | 8/1996 | Okajima |
| 5,563,832 A | 10/1996 | Kagami |
| 5,568,408 A | 10/1996 | Maeda |
| 5,570,293 A | 10/1996 | Tanaka et al. |
| 5,581,510 A | 12/1996 | Furusho et al. |
| 5,590,069 A | 12/1996 | Levin |
| 5,600,171 A | 2/1997 | Makihara et al. |
| 5,603,412 A | 2/1997 | Gross, Jr. et al. |
| 5,606,193 A | 2/1997 | Ueda et al. |
| 5,617,366 A | 4/1997 | Yoo |
| 5,619,469 A | 4/1997 | Joo |
| 5,625,816 A | 4/1997 | Burdick et al. |
| 5,642,307 A | 6/1997 | Jernigan |
| 5,654,204 A | 8/1997 | Anderson |
| 5,726,074 A | 3/1998 | Yabe |
| 5,764,650 A | 6/1998 | Debenham |
| 5,787,012 A | 7/1998 | Levitt |
| 5,787,190 A | 7/1998 | Peng et al. |
| 5,801,067 A | 9/1998 | Shaw et al. |
| 5,801,965 A | 9/1998 | Takagi et al. |
| 5,805,472 A | 9/1998 | Fukasawa |
| 5,822,218 A | 10/1998 | Moosa et al. |
| 5,828,778 A | 10/1998 | Hagi et al. |
| 5,837,558 A | 11/1998 | Zuniga et al. |
| 5,844,803 A | 12/1998 | Beffa |
| 5,856,923 A | 1/1999 | Jones et al. |
| 5,865,319 A | 2/1999 | Okuda et al. |
| 5,867,505 A | 2/1999 | Beffa |
| 5,889,674 A | 3/1999 | Burdick et al. |
| 5,890,807 A | 4/1999 | Ingel et al. |
| 5,895,962 A | 4/1999 | Zheng et al. |
| 5,907,492 A | 5/1999 | Akram et al. |
| 5,915,231 A | 6/1999 | Beffa |
| 5,927,512 A | 7/1999 | Beffa |
| 5,946,497 A | 8/1999 | Lee et al. |
| 5,950,012 A | 9/1999 | Shiell et al. |
| 5,963,881 A | 10/1999 | Kahn et al. |
| 5,976,899 A | 11/1999 | Farnworth et al. |
| 5,991,699 A | 11/1999 | Kulkarni et al. |
| 5,994,915 A | 11/1999 | Farnworth et al. |
| 6,000,830 A | 12/1999 | Asano et al. |
| 6,018,686 A | 1/2000 | Orso et al. |
| 6,049,624 A | 4/2000 | Wilson et al. |
| 6,055,463 A | 4/2000 | Cheong et al. |
| 6,067,507 A | 5/2000 | Beffa |
| 6,072,574 A | 6/2000 | Zeimantz |
| 6,075,216 A | 6/2000 | Nakamura et al. |
| 6,100,486 A | 8/2000 | Beffa |
| 6,122,563 A | 9/2000 | Beffa |
| 6,130,442 A | 10/2000 | Di Zenzo et al. |
| 6,138,256 A | 10/2000 | Debenham |
| 6,147,316 A | 11/2000 | Beffa |
| 6,148,307 A | 11/2000 | Burdick et al. |
| 6,190,972 B1 | 2/2001 | Zheng et al. |
| 6,194,738 B1 | 2/2001 | Debenham et al. |
| 6,208,947 B1 | 3/2001 | Beffa |
| 6,219,810 B1 | 4/2001 | Debenham |
| 6,226,394 B1 | 5/2001 | Wilson et al. |
| 6,259,520 B1 | 7/2001 | Zeimantz |
| 6,265,232 B1 | 7/2001 | Simmons |
| 6,292,009 B1 | 9/2001 | Farnworth et al. |
| 6,307,171 B1 | 10/2001 | Beffa |
| 6,350,959 B1 | 2/2002 | Beffa |
| 6,363,295 B1 | 3/2002 | Akram |
| 6,363,329 B2 | 3/2002 | Beffa |
| 6,365,421 B2 | 4/2002 | Debenham et al. |
| 6,365,860 B1 | 4/2002 | Beffa |
| 6,365,861 B1 | 4/2002 | Beffa |
| 6,373,011 B1 | 4/2002 | Beffa |
| 6,373,566 B2 | 4/2002 | Zeimantz |
| 6,400,840 B2 | 6/2002 | Wilson et al. |
| 6,424,168 B1 | 7/2002 | Farnworth et al. |
| 6,427,092 B1 | 7/2002 | Jones et al. |
| 6,437,271 B1 | 8/2002 | Beffa |
| 6,441,897 B1 | 8/2002 | Zeimantz |
| 6,504,123 B2 | 1/2003 | Beffa |
| 6,529,793 B1 | 3/2003 | Beffa |
| 6,534,785 B1 | 3/2003 | Farnworth et al. |
| 6,553,276 B2 | 4/2003 | Akram et al. |
| 6,588,854 B2 | 7/2003 | Wilson et al. |
| 6,594,611 B2 | 7/2003 | Beffa |
| 6,613,590 B2 | 9/2003 | Simmons |

| | | | | | | |
|---|---|---|---|---|---|---|
| 6,636,068 B2 | 10/2003 | Farnworth | JP | 02246312 A | 10/1990 |
| 6,654,114 B2 | 11/2003 | Zeimantz | JP | 04080949 A | 3/1992 |
| 6,703,573 B2 | 3/2004 | Beffa | JP | 04318911 A | 11/1992 |
| 6,788,993 B2 | 9/2004 | Beffa | JP | 05013529 A | 1/1993 |
| 6,895,538 B2 | 5/2005 | Benedix et al. | JP | 05074909 | 3/1993 |
| 6,944,567 B2 | 9/2005 | Beffa | JP | 05121573 A | 5/1993 |
| 7,120,287 B2 | 10/2006 | Wilson et al. | JP | 05315207 | 11/1993 |
| 7,120,513 B1 | 10/2006 | Akram et al. | JP | 06013443 A | 1/1994 |
| 7,124,050 B2 | 10/2006 | Beffa | JP | 06267809 A | 9/1994 |
| 7,155,300 B2 | 12/2006 | Akram et al. | JP | 06349691 A | 12/1994 |

FOREIGN PATENT DOCUMENTS

| | | | |
|---|---|---|---|
| JP | 58050728 A | 3/1983 |
| JP | 58052814 A | 3/1983 |
| JP | 58060529 A | 4/1983 |
| JP | 61120433 A | 6/1986 |
| JP | 02164017 A | 6/1990 |
| JP | 07050233 | 2/1995 |
| JP | 07066091 A | 3/1995 |
| JP | 07-335510 | 12/1995 |
| JP | 08162380 A | 6/1996 |
| JP | 10104315 A | 4/1998 |
| JP | 11008327 | 1/1999 |
| SU | 1151333 A | 4/1985 | ued States Patent No. 7,502,659 B2

SORTING A GROUP OF INTEGRATED CIRCUIT DEVICES FOR THOSE DEVICES REQUIRING SPECIAL TESTING

CROSS-REFERENCE TO RELATED APPLICATIONS

This application is a continuation of application Ser. No. 11/240,178, filed Sep. 29, 2005, now U.S. Pat. No. 7,117,063, Oct. 3, 2006, which is a continuation of application Ser. No. 10/791,193, filed Mar. 2, 2004, now U.S. Pat. No. 7,107,117, issued Sep. 12, 2006, which is a continuation of application Ser. No. 10/379,257, filed Mar. 3, 2003, now U.S. Pat. No. 6,788,993, issued Sep. 7, 2004, which is a continuation of application Ser. No. 09/607,201, filed Jun. 28, 2000, now U.S. Pat. No. 6,529,793, issued Mar. 4, 2003, which is a continuation of application Ser. No. 09/145,758, filed Sep. 2, 1998, now U.S. Pat. No. 6,122,563, issued Sep. 19, 2000, which is a continuation of application Ser. No. 08/801,565, filed Feb. 17, 1997, now U.S. Pat. No. 5,844,803, issued Dec. 1, 1998, which is related to: a application having Ser. No. 08/591,238, entitled "METHOD AND APPARATUS [sic] FOR STORAGE OF TEST RESULTS WITHIN AN INTEGRATED CIRCUIT," and filed Jan. 17, 1996; a application having Ser. No. 08/664,109, entitled "A STRUCTURE AND A METHOD FOR STORING INFORMATION IN A SEMICONDUCTOR DEVICE," and filed Jun. 13, 1996, now U.S. Pat. No. 5,895,962, issued Apr. 20, 1999; an application having Ser. No. 08/785,353, entitled "METHOD FOR SORTING INTEGRATED CIRCUIT DEVICES," and filed Jan. 17, 1997, now U.S. Pat. No. 5,927,512, issued Jul. 27, 1999; a application having Ser. No. 08/822,731, entitled "METHOD FOR CONTINUOUS, NON LOT-BASED INTEGRATED CIRCUIT MANUFACTURING," and filed Mar. 24, 1997, now U.S. Pat. No. 5,856,923, issued Jan. 5, 1999; a application having Ser. No. 08/806,442, entitled "METHOD IN AN INTEGRATED CIRCUIT (IC) MANUFACTURING PROCESS FOR IDENTIFYING AND RE-DIRECTING IC'S [sic] MIS-PROCESSED DURING THEIR MANUFACTURE," and filed Feb. 26, 1997, now U.S. Pat. No. 5,915,231, issued Jun. 22, 1999; and a application having Ser. No. 08/871,015, entitled "METHOD FOR USING DATA REGARDING MANUFACTURING PROCEDURES INTEGRATED CIRCUITS (IC'S) [sic] HAVE UNDERGONE, SUCH AS REPAIRS, TO SELECT PROCEDURES THE IC'S [sic] WILL UNDERGO, SUCH AS ADDITIONAL REPAIRS," and filed Jun. 6, 1997, now U.S. Pat. No. 5,907,492, issued May 25, 1999.

BACKGROUND OF THE INVENTION

1. Field of the Invention

The present invention relates in general to integrated circuit (IC) manufacturing and, more specifically, to methods in IC manufacturing processes for sorting IC devices using identification (ID) codes, such as fuse IDs, in the devices.

2. State of the Art

Integrated circuits (ICs) are small electronic circuits formed on the surface of a wafer of semiconductor material, such as silicon, in an IC manufacturing process referred to as "fabrication." Once fabricated, ICs are electronically probed to evaluate a variety of their electronic characteristics, cut from the wafer on which they were formed into discrete IC dice or "chips," and then assembled for customer use using various well-known IC packaging techniques, including lead frame packaging, Chip-On-Board (COB) packaging, and flip-chip packaging.

Before being shipped to customers, packaged ICs are generally tested to ensure they will function properly once shipped. Testing typically involves a variety of known test steps, such as pre-grade, burn-in, and final, which test ICs for defects and functionality and grade ICs for speed.

As shown in FIG. 1, a variety of data are collected as ICs proceed through an IC manufacturing process. For example, fabrication deviation data reflecting quality deviations, such as fabrication process errors, are collected during fabrication and summarized in one or more reports commonly referred to as "Quality Deviation Reports" (QDRs). Similarly, data are collected during probe which record the various electronic characteristics of the ICs tested during probe.

When any of the wafers in a wafer lot are deemed to be unreliable because they are low yielding wafers, as indicated by the collected probe data, or because they are misprocessed wafers, as indicated by the QDRs, all the ICs from the wafers in the wafer lot typically undergo special testing, such as enhanced reliability testing, that is more extensive and strict than standard testing. Since a wafer lot typically consists of fifty or more wafers, many ICs that undergo the special testing do not require it because they come from wafers that are not deemed unreliable. Performing special testing on ICs that do not need it is inefficient because such testing is typically more time-consuming and uses more resources than standard testing. Therefore, there is a need in the art for a method of identifying those ICs in a wafer lot that require special testing and sorting the ICs in the wafer lot into those that require special testing and those that do not.

As described in U.S. Pat. Nos. 5,301,143, 5,294,812, and 5,103,166, some methods have been devised to electronically identify individual ICs. Such methods take place "off" the manufacturing line, and involve the use of electrically retrievable identification (ID) codes, such as so-called "fuse IDs," programmed into individual ICs to identify the ICs. The programming of a fuse ID typically involves selectively blowing an arrangement of fuses and anti-fuses in an IC so that when the fuses or anti-fuses are accessed, they output a selected ID code. Unfortunately, none of these methods addresses the problem of identifying and sorting ICs "on" a manufacturing line.

BRIEF SUMMARY OF THE INVENTION

An inventive method in an integrated circuit (IC) manufacturing process for sorting IC devices of the type having an identification (ID) code, such as a fuse ID, into those devices requiring a first testing process, such as enhanced reliability testing, and those devices requiring a second testing process, such as standard testing, includes storing data in association with the ID code of each of the devices that indicates each of the devices requires the first or the second testing process. The data may include fabrication deviation data, such as a Quality Deviation Report (QDR), probe data, standard test data, or special test data, such as enhanced reliability testing data. Also, the data may, for example, indicate the need for the first or second testing process by indicating that one or more semiconductor wafers or wafer lots have been misprocessed, or have relatively low yields at probe or during testing. Further, the data may be generated by IC devices other than those devices to be sorted, and may be generated at a point in the manufacturing process before or after the point at which sorting will take place.

The ID code of each of the IC devices to be sorted is automatically read. This may be accomplished, for example, by electrically retrieving a unique fuse ID programmed into each of the devices, or by optically reading a unique laser fuse ID programmed into each of the devices. Also, the data stored in association with the automatically read ID code of each of the IC devices is accessed, and the devices are then sorted in accordance with the accessed data into those devices requiring the first testing process and those devices requiring the second testing process.

The present invention thus provides a method that directs those ICs needing enhanced reliability testing to such testing without the need for all ICs from the same wafer lot, including those from reliable wafers, to proceed through special testing.

In additional embodiments, the method described above is included in methods for manufacturing IC devices and Multi-Chip Modules (MCMs) from semiconductor wafers.

In a further embodiment, an inventive sorting method uses special test data generated by a first group of IC devices undergoing special testing to sort a second group of devices of the type having an identification (ID) code, such as a fuse ID, into those devices requiring the special testing and those requiring standard testing. Specifically, the method includes storing data in association with the ID code of some of the IC devices in the second group that indicates the devices require special testing. Special test data generated by the first group of devices is then stored in association with the ID codes of the previously mentioned devices in the second group, and the special test data indicates these devices in the second group that were previously indicated to require special testing instead require only standard testing. The ID codes of these devices in the second group are then automatically read, the data stored in association with the ID codes is accessed, and the second group of devices is sorted in accordance with the accessed data so the appropriate devices in the second group undergo standard testing.

DETAILED DESCRIPTION OF THE INVENTION

Figure 1:
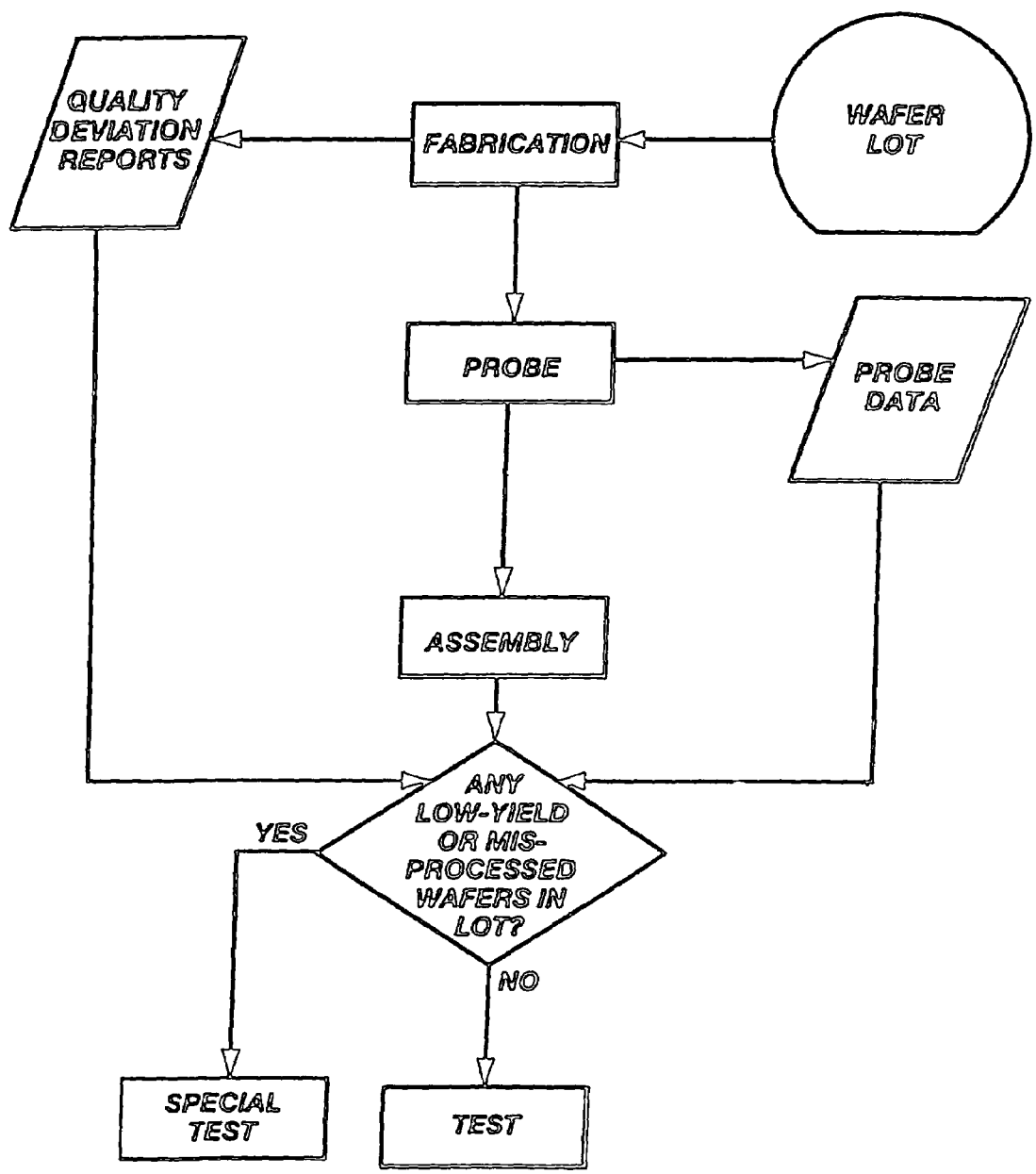
FIG. 1 is a flow diagram illustrating a conventional procedure in an integrated circuit (IC) manufacturing process for directing ICs to special testing, such as enhanced reliability testing.
Figure 2:
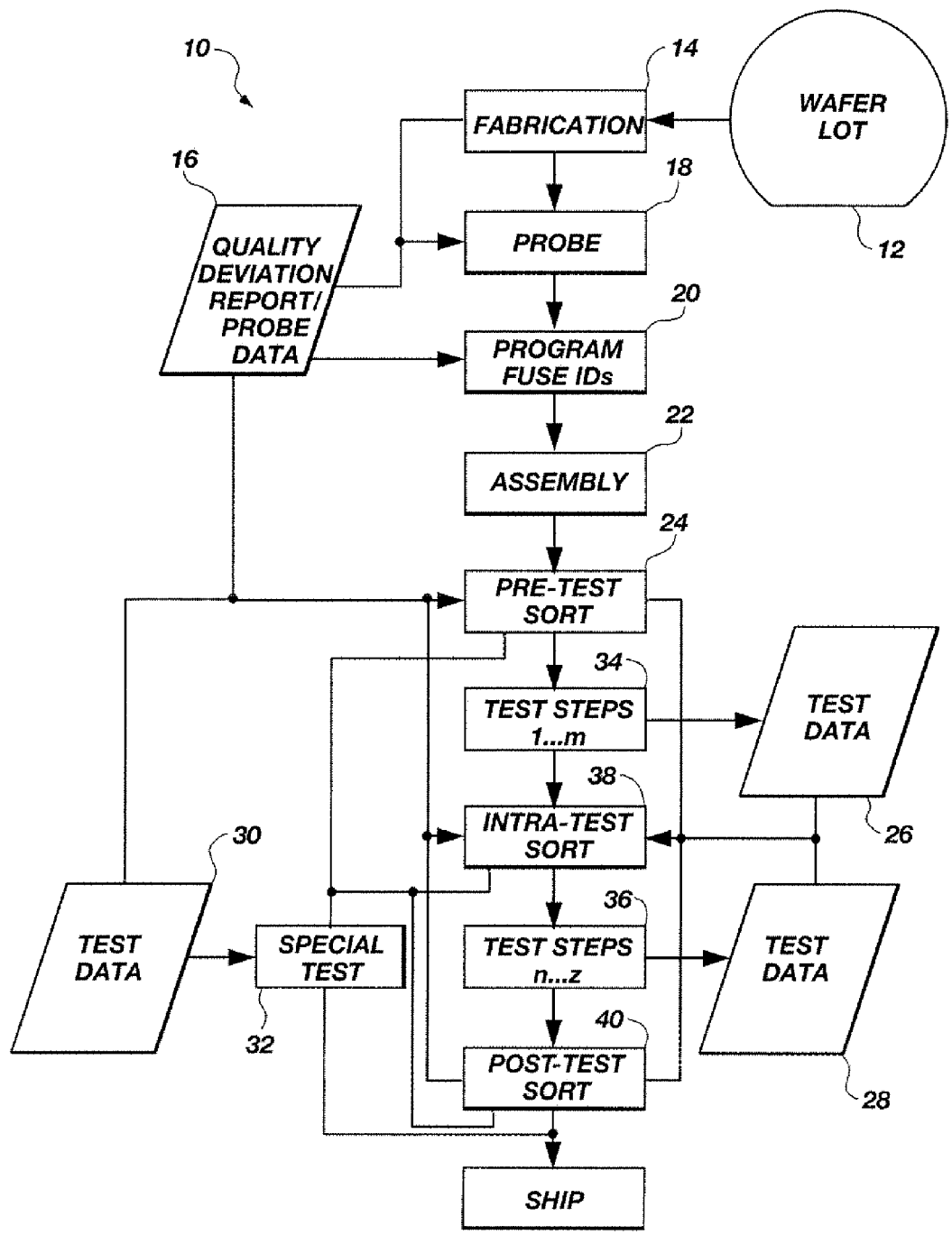
FIG. 2 is a flow diagram illustrating a procedure in an IC manufacturing process for directing ICs to special testing, such as enhanced reliability testing, in accordance with a preferred embodiment of the present invention.

As shown in FIG. 2, an inventive method 10 for manufacturing integrated circuits (ICs) from a group of semiconductor wafers in a wafer lot 12 includes the step 14 of fabricating the ICs on the wafers. Any fabrication process errors occurring during the fabrication step 14 are noted in a Quality Deviation Report (QDR) 16. It will be understood by those having skill in the field of this invention that the present invention is applicable to any IC devices, including Dynamic Random Access Memory (DRAM) ICs, Static Random Access Memory (SRAM) ICs, Synchronous DRAM (SDRAM) ICs, processor ICs, Single In-line Memory Modules (SIMMs), Dual In-line Memory Modules (DIMMs), and other Multi-Chip Modules (MCMs).

After fabrication, the ICs are electronically probed in a probe step 18 to evaluate a variety of their electronic characteristics, and data from the probe step 18 are noted and stored as probe data 16. The probe data 16 may include, for example, data indicating that one or more wafers are providing a relatively low yield of ICs that are functional at probe, or data indicating that an abnormal number of problems are associated with wafers from a particular wafer lot, or with ICs from the same position on a series of wafers, or with ICs processed by a particular piece of fabrication equipment.

Before, during, or after the probe step 18, ICs fabricated on the wafers are programmed in a program step 20 in the manner described above with a fuse identification (ID) unique to each IC. The fuse ID for each IC is then stored as data in association with the QDR/probe data 16 for that IC. The fuse ID may identify, for example, a wafer lot ID, the week the ICs were fabricated, a wafer ID, a die location on the wafer, and a fabrication facility ID. It will be understood, of course, that the present invention includes within its scope ICs having any ID code, including those having fuse IDs. It will also be understood that the ID code for each IC need not be unique, but instead may only specify the wafer the IC comes from, for example.

Once programmed, the ICs proceed through an assembly step 22 and then to a sort step 24. At this point in the manufacturing process, QDR/probe data 16 is available not only for those ICs presently at the sort step 24, but also for those ICs trailing the ICs presently at the sort step 24 which have completed the probe step 18. Therefore, sufficient QDR/probe data 16 may exist to determine that a particular wafer, for example, is unreliable as a result of low yields from the wafer at the probe step 18, or as a result of a processing error at the fabrication step 14. Similarly, sufficient QDR/probe data 16 may exist to determine that wafers from a particular wafer lot are unreliable, or that ICs from a particular location on a series of wafers are unreliable, or that ICs processed by a particular piece of fabrication equipment are unreliable.

As noted above, ICs that are deemed to be unreliable typically require some form of special testing, such as enhanced reliability testing, in which testing standards and methods are more strict than standard testing. Therefore, at the sort step 24, the fuse IDs of the ICs are automatically read so the QDR/probe data 16 (and test data 26, 28, and 30 as described below) stored in association with the fuse IDs may be accessed and used to sort the ICs into those ICs requiring special testing in a special test step 32, and those ICs requiring only standard testing in one or more test steps 34 and 36. It should be understood that although the fuse IDs are typically read electronically, they may also be read optically if the fuse ID consists of "blown" laser fuses that are optically accessible.

In general, the test data 26, 28, and 30 comprise data generated by ICs at one point in the IC manufacturing process which is used to sort ICs under test at a different point in the process. Thus, for example, test data 26 and 28 generated by ICs from a particular wafer may indicate that the wafer is unreliable because of low yields during the test steps 34 and 36. As a result, ICs from the same wafer that have yet to be tested may be diverted at the sort step 24 to the special test step 32.

Similarly, test data 26 and 28 generated by ICs from a particular wafer lot, or by ICs from a particular die location on a series of wafers, or by ICs that were processed by a particular piece of fabrication equipment at the fabrication step 14, may indicate that ICs respectively from the same wafer lot, or from the same die location, or that were processed by the same piece of fabrication equipment, are unreliable because of low yields or other problems at the test steps 34 and 36. As a result, ICs respectively from the same wafer lot, or from the same die location, or that were processed by the same piece of fabrication equipment, that have yet to be tested may be diverted at the sort step 24 to the special test step 32.

Likewise, test data 30 generated by ICs deemed unreliable and tested in the special test step 32 may indicate that similarly situated ICs that have yet to be tested are not, in fact, unreliable, and therefore need not be diverted to the special test step 32. The test data 26, 28, and 30 will be described in more detail below.

Thus, the present invention provides a method 10 that directs those ICs needing special testing to the special testing step 32 without the need for all ICs from the wafer lot 12, including those from reliable wafers, to proceed through the special testing step 32. In addition, because the method 10 takes advantage of test data 26 and 28 generated by already tested ICs to sort yet-to-be-tested ICs, the method 10 advantageously provides real-time feedback of data back up the manufacturing line. Further, because the method 10 takes advantage of QDR/probe data 16 generated by ICs trailing ICs presently at the sort step 24 to sort those ICs presently at the sort step 24, the method 10 advantageously provides real-time feedback of data down the manufacturing line.

Those ICs that proceed on to the standard test step 34 are tested in a variety of well-known ways so the test data 26 may be generated and stored for each IC in association with the fuse ID of the IC. It should be understood that the test step 34 may comprise many individual test procedures, or just one. It should also be understood that the test data 26 may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 34, and test results for the ICs from the various stages of the test step 34.

The ICs tested in the test step 34 then proceed on to an intra-test sort step 38, where the fuse IDs of the tested ICs are again automatically read so the ICs can be sorted in accordance with the QDR/probe data 16, the test data 26, and the test data 28 and 30 of other previously tested ICs, into those ICs requiring special testing in the special test step 32, and those ICs eligible to continue with standard testing in the test step 36.

At the intra-test sort step 38, the QDR/probe data 16 and test data 26, 28, and 30 may identify those ICs in need of special testing in the same manner as described above with respect to the sort step 24. In addition, the test data 26 and 28 may indicate that ICs that were tested by a particular piece of test equipment at the test step 34 are unreliable because of low yields or other problems at the test steps 34 and 36. As a result, ICs that were processed by the same piece of test equipment may be diverted at the sort step 38 to the special test step 32.

Of course, it should be understood that the special test procedures conducted on ICs sorted out in the intra-test sort step 38 may differ from those conducted on ICs sorted out in the sort step 24. Also, it should be understood that the present invention includes within its scope those methods which include only a pre-test sort step, such as the sort step 24, or only an intra-test sort step, such as the sort step 38, or any combination thereof.

Those ICs that continue on to the standard test step 36 are also tested in a variety of well-known ways so the test data 28 may be generated and stored for each IC in association with the fuse ID of the IC. It should be understood that the test step 36 may comprise many individual test procedures, or just one. It should also be understood that the test data 28 may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 36, and test results for the ICs from the various stages of the test step 36.

The ICs tested in the test step 36 then proceed on to a post-test sort step 40, where the fuse IDs of the tested ICs are yet again automatically read so the ICs can be sorted in accordance with the QDR/probe data 16, the test data 26 and 28, and the test data 30 of other previously tested ICs, into those ICs requiring special testing in the special test step 32, and those ICs eligible to be shipped (the disposition of non-shippable ICs is not shown).

At the post-test sort step 40, the QDR/probe data 16 and test data 26, 28, and 30 may identify those ICs in need of special testing in the same manner as described above with respect to the sort steps 24 and 38. In addition, the test data 28 may indicate that ICs that were tested by a particular piece of test equipment at the test step 36 are unreliable because of low yields or other problems at the test step 36. As a result, ICs that were processed by the same piece of test equipment may be diverted at the sort step 40 to the special test step 32.

Of course, it should be understood that the special test procedures conducted on ICs sorted out in the post-test sort step 40 may differ from those conducted on ICs sorted out in the sort step 24 and the intra-test sort step 38. Also, it should be understood that the present invention includes within its scope those methods which include only a pre-test sort step, such as the sort step 24, only an intra-test sort step, such as the sort step 38, or only a post-test sort step, such as the sort step 40, or any combination thereof.

Those ICs that proceed on to the special test step 32 are subjected to a variety of special tests, such as enhanced reliability tests, so the test data 30 may be generated and stored for each IC in association with the fuse ID of the IC. It should be understood that the special test step 32 may comprise many individual test procedures, or just one. It should also be understood that the test data 30 may include data such as the following: data identifying the testing equipment that tested the ICs, operating personnel who operated the testing equipment, and the set-up of the equipment when the ICs were tested; and data indicating the time and date the ICs were tested, the yield of shippable ICs through the test step 32, and test results for the ICs from the various stages of the test step 32. Of course, those ICs that pass the special test step 32 are generally allowed to ship.

The present invention thus provides an inventive method for identifying those ICs in a wafer lot that require special testing through the use of ID codes, such as fuse IDs, and for sorting the ICs in the wafer lot into those that require special testing and those that do not using the ID codes of the ICs. The invention also advantageously provides real-time feedback of data up and down the IC manufacturing line by using probe and test data generated by already probed or tested ICs to sort yet-to-be-tested ICs.

Although the present invention has been described with reference to a preferred embodiment, the invention is not limited to this embodiment. For example, while the various steps of the preferred embodiment have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

What is claimed is:

1. A method in an integrated circuit (IC) manufacturing process for sorting a plurality of IC devices of the type having an identification (ID) code into those IC devices requiring a first testing process and those IC devices requiring a second testing process, the method comprising:

programming each of the plurality of IC devices with a unique ID code to the IC device while in wafer form;

storing data in association with the ID code of each of the plurality of IC devices that indicates each of the IC devices requires one of the first and second testing processes for automatically reading the ID code of each of the plurality of IC devices;

accessing the testing process requirement data stored in association with the automatically read ID code of each of the plurality of IC devices; and sorting the IC devices in accordance with the accessed data into those IC devices requiring the first testing process and those IC devices requiring the second testing process.

2. The method of claim 1, wherein the step of storing data in association with the ID code of each of the plurality of IC devices comprises storing at least one of fabrication deviation data, probe data, standard test data, special test data, and enhanced reliability testing data in association with the ID code of at least some of the IC devices.

3. The method of claim 1, wherein the step of storing data comprises storing a Quality Deviation Report (QDR).

4. The method of claim 1, wherein the step of storing data comprises storing data indicating one or more semiconductor wafers have been misprocessed.

5. The method of claim 1, wherein the step of storing data comprises storing data indicating one or more semiconductor wafers have relatively low yields.

6. The method of claim 1, wherein the step of storing data comprises storing data indicating one or more semiconductor wafer lots have relatively low yields.

7. The method of claim 1, wherein the step of storing data comprises storing data indicating IC devices from the same die location on each of a series of semiconductor wafers have relatively low yields.

8. The method of claim 1, wherein the step of storing data comprises storing data indicating semiconductor wafers fabricated using the same piece of fabrication equipment have relatively low yields.

9. The method of claim 1, wherein the step of storing data comprises storing data indicating semiconductor wafers tested using the same piece of test equipment have relatively low yields.

10. The method of claim 1, wherein the first and second testing processes comprise respective standard and special testing processes, wherein the step of storing data comprises storing special test data indicating that IC devices previously indicated to require the special testing process instead require the standard testing process.

11. The method of claim 1, wherein the step of storing data in association with the ID code of each of the plurality of IC devices comprises storing data in association with the ID codes of one or more IC devices other than those IC devices in the plurality of IC devices to be sorted that are at a different point in the IC manufacturing process than the IC devices to be sorted.

12. The method of claim 1, wherein the step of automatically reading the ID code of each of the plurality of IC devices comprises electrically retrieving a unique fuse ID programmed into each of the plurality of IC devices.

13. The method of claim 1, wherein the step of automatically reading the ID code of each of the plurality of IC devices comprises optically reading a unique ID code provided on each of the plurality of IC devices.

14. The method of claim 13, wherein the step of optically reading a unique ID code provided on each of the plurality of IC devices comprises optically reading a unique laser fuse ID programmed into each of the plurality of IC devices.

15. The method of claim 1, wherein the step of sorting the IC devices in accordance with the accessed data into those IC devices requiring the first testing process and those IC devices requiring the second testing process comprises sorting the IC devices before a standard testing process into those IC devices requiring an enhanced reliability testing process and those IC devices requiring the standard testing process.

16. The method of claim 1, wherein the step of sorting the IC devices in accordance with the accessed data into those IC devices requiring the first testing process and those IC devices requiring the second testing process comprises sorting the IC devices during a standard testing process into those IC devices requiring an enhanced reliability testing process and those IC devices requiring the standard testing process.

17. The method of claim 1, wherein the step of sorting the IC devices in accordance with the accessed data into those IC devices requiring the first testing process and those IC devices requiring the second testing process comprises sorting the IC devices after a standard testing process into those IC devices requiring an enhanced reliability testing process and those IC devices finished with testing.

18. The method of claim 1, wherein the step of accessing the testing process requirement data comprises accessing one of fabrication equipment data, fabrication personnel data, fabrication set-up data, time and date data, yield data, and test data.

19. The method of claim 1, wherein each of the IC devices has an associated lot ID, wherein the step of accessing the testing process requirement data comprises accessing data associated with the lot ID of the IC device associated with each of the automatically read ID codes.

20. A method of manufacturing integrated circuit (IC) devices from semiconductor wafers, the method comprising:

storing a permanent unique identification (ID) code to each IC in each of a plurality of ICs of a plurality of semiconductor wafers;

storing data in association with the ID code associated with each of the plurality of IC devices that indicates each of the IC devices requires one of first and second testing processes for automatically reading the unique ID code associated with each of the plurality of IC devices accessing the testing process requirement data stored in association with for the automatically read ID code associated with each of the plurality of IC devices;

sorting the IC devices in accordance with the accessed data into those IC devices requiring the first testing process and those IC devices requiring the second testing process; and testing the sorted IC devices using the first and second testing processes.

21. The method of claim 20, wherein the step of fabricating a plurality of ICs on each of the wafers comprises fabricating ICs selected from a group comprising Dynamic Random Access Memory (DRAM) ICs, Static Random Access Memory (SRAM) ICs, Synchronous DRAM (SDRAM) ICs, and processor ICs.

22. The method of claim 20, wherein the step of causing each of the ICs on each of the wafers to permanently store an ID code comprises programming each of the ICs on each of the wafers to permanently store a unique fuse ID.

23. The method of claim 22, wherein the step of programming each of the ICs on each of the wafers to permanently store a unique fuse ID comprises programming at least one of fuses and anti-fuses in each of the ICs on each of the wafers to permanently store a unique fuse ID that indicates at least one of a lot ID, work week, wafer ID, die location, and fabrication facility ID.

24. The method of claim 20, wherein the step of assembling each of the IC dice into an IC device comprises assembling each of the IC dice into an IC device selected from a group comprising a lead frame IC device, a Chip-On-Board (COB) IC device, and a flip-chip IC device.

25. The method of claim 20, wherein the step of storing data occurs during at least one of the steps of fabricating and testing.

26. The method of claim 20, wherein the steps of automatically reading the ID code and sorting occur at one of a point before the step of testing, a point during the step of testing, and a point after the step of testing.

27. A method in an integrated circuit (IC) manufacturing process for separating IC devices requiring special testing from a group of IC devices undergoing standard test procedures, the IC devices being of the type having an identification (ID) code, the method comprising:
   programming each IC device to have a unique ID code;
   storing data in association with the ID code of the plurality of IC devices that indicates each of the plurality of IC devices requires one of special testing and standard testing for automatically reading the ID code of each of the plurality of IC devices for accessing the data stored in association with the automatically read ID code of each of the plurality of IC devices; and
   sorting the IC devices during the standard test procedures in accordance with the accessed data for those IC devices requiring special testing.

28. A method in an integrated circuit (IC) manufacturing process for separating IC devices requiring special testing from a group of IC devices undergoing standard test procedures, the IC devices being of the type having an identification (ID) code, the method comprising:
   storing a unique ID code in each IC device of a plurality of IC devices in wafer form:
   storing fabrication deviation data in association with the ID code of at least one of the plurality of IC devices that indicates the at least one of the plurality of IC devices requires special testing for automatically reading the ID code of the at least one of the plurality of IC devices for accessing the fabrication deviation data stored in association with the automatically read ID code of the at least one of the plurality of IC devices; and
   sorting the IC devices in accordance with the accessed data for the at least one of the plurality of IC devices requiring special testing.

29. A method in an integrated circuit (IC) manufacturing process for separating IC devices requiring special testing from a group of IC devices that have undergone standard test procedures, the IC devices being of the type having an identification (ID) code, the method comprising:
   storing a unique ID code in each IC device to the IC device;
   storing data in association with the ID code of at least one of the plurality of IC devices that indicates the at least one of the plurality of IC devices requires special testing for automatically reading the ID code of the at least one of the plurality of IC devices for accessing the data stored in association with the automatically read ID code of the at least one of the plurality of IC devices; and
   sorting the IC devices using the unique ID code in accordance with the accessed data for the at least one of the plurality of IC devices requiring special testing.

30. A method in an integrated circuit (IC) manufacturing process for using special test data generated by a first group of IC devices undergoing special testing to sort a second group of IC devices into those requiring the special testing and those requiring standard testing, the IC devices being of the type having an identification (ID) code, the method comprising:
   programming each IC device to have a unique ID code to the IC device;
   storing data in association with the ID code of at least one of the second group of IC devices indicating the at least one of the second group of IC devices requires special testing for storing special test data generated by the first group of IC devices in association with the ID code of the at least one of the second group of IC devices indicating the at least one of the second group of IC devices previously indicated to require special testing instead requires standard testing for automatically reading the ID code of the at least for one of the second group of IC devices for accessing the data stored in association for with the automatically read ID code of the at least one of the second group of IC devices; and
   sorting the second group of IC devices using the unique ID code of each IC device in accordance with the accessed data so the at least one of the second group of IC devices undergoes standard testing.

31. A manufacturing method for sorting semiconductor devices each having an identification code after a first testing process to determine any semiconductor device requiring a second testing process comprising:
   storing data in association with the identification code of each semiconductor device that indicates if the semiconductor device requires a second testing process;
   automatically reading the identification code of each semiconductor device;
   accessing the testing process requirement data stored in association with the automatically read identification code of each semiconductor device; and
   sorting the semiconductor device in accordance with the accessed data into those semiconductor devices only requiring a first testing process and those semiconductor devices requiring the second testing process.

32. A classification method for semiconductor devices each having an identification code after a first testing process to determine any semiconductor device requiring a second testing process comprising:
   storing data in association with the identification code of each semiconductor device that indicates if the semiconductor device requires a second testing process;
   automatically reading the identification code of each semiconductor device;
   accessing the testing process requirement data stored in association with the automatically read identification code of each semiconductor device; and
   sorting the semiconductor device in accordance with the accessed data into those semiconductor devices only requiring a first testing process and those semiconductor devices requiring the second testing process.

33. A quality assurance method for semiconductor devices having an identification code after a first testing process to determine any semiconductor device requiring a second testing process comprising:
   storing data in association with the identification code of each semiconductor device that indicates if the semiconductor device requires a second testing process for the quality thereof;
   automatically reading the identification code of each semiconductor device;

accessing the testing process requirement data stored in association with the automatically read identification code of each semiconductor device; and sorting the semiconductor device in accordance with the accessed data into those semiconductor devices only requiring a first testing process and those semiconductor devices requiring the second testing process for the quality thereof.

34. A method for determining conformance of semiconductor devices to design specifications of each semiconductor device having an identification code after a first testing process to determine any semiconductor device requiring a second testing process to comply with design specifications comprising:

storing data in association with the identification code of each semiconductor device that indicates if the semiconductor device requires a second testing process to comply with design specifications;

automatically reading the identification code of each semiconductor device;

accessing the testing process requirement data stored in association with the automatically read identification code of each semiconductor device; and sorting the semiconductor device in accordance with the accessed data into those semiconductor devices only requiring a first testing process and those semiconductor devices requiring the second testing process to comply with design specifications.

* * * * *

UNITED STATES PATENT AND TRADEMARK OFFICE
CERTIFICATE OF CORRECTION

| | |
|---|---|
| PATENT NO. | : 7,502,659 B2 |
| APPLICATION NO. | : 11/543246 |
| DATED | : March 10, 2009 |
| INVENTOR(S) | : Beffa |

It is certified that error appears in the above-identified patent and that said Letters Patent is hereby corrected as shown below:

In column 8, line 46, in Claim 20, before "accessing" insert -- for --.

In column 8, line 47, in Claim 20, after "with" delete -- for --.

In column 9, line 40, in Claim 28, delete "form:" and insert -- form; --, therefor.

In column 10, line 18, in Claim 30, before "one" delete "for".

In column 10, line 19, in Claim 30, after "association" delete "for".

Signed and Sealed this

Thirtieth Day of June, 2009

JOHN DOLL
*Acting Director of the United States Patent and Trademark Office*